US012750984B2

(12) United States Patent
Korta et al.

(10) Patent No.: US 12,750,984 B2
(45) Date of Patent: Sep. 29, 2026

(54) SERVER RACK FOR ELECTRONIC COMPONENTS

(71) Applicant: Aptiv Technologies AG, Schaffhausen (CH)

(72) Inventors: Jakub Korta, Cracow (PL); Tomasz Dolot, Cracow (PL); Grzegorz Puchala, Cracow (PL); Jakub Zborowski, Cracow (PL); Michal Wisniowski, Libiaz (PL)

(73) Assignee: Aptiv Technologies AG, Schaffhausen (CH)

( * ) Notice: Subject to any disclaimer, the term of this patent is extended or adjusted under 35 U.S.C. 154(b) by 152 days.

(21) Appl. No.: 18/395,181

(22) Filed: Dec. 22, 2023

(65) Prior Publication Data

US 2024/0215206 A1 Jun. 27, 2024

(30) Foreign Application Priority Data

Dec. 22, 2022 (EP) .................................... 22216025

(51) Int. Cl.
*H05K 7/20* (2006.01)

(52) U.S. Cl.
CPC ..... *H05K 7/20781* (2013.01); *H05K 7/20854* (2013.01); *H05K 7/20872* (2013.01)

(58) Field of Classification Search
None
See application file for complete search history.

(56) References Cited

U.S. PATENT DOCUMENTS

| | | | | |
|---|---|---|---|---|
| 11,470,742 B2 * | 10/2022 | Xue | H05K 7/20872 |
| 11,515,232 B2 * | 11/2022 | Chiu | H01L 23/49811 |
| 11,711,910 B2 * | 7/2023 | Gao | H05K 7/20272 361/699 |
| 2009/0225515 A1 * | 9/2009 | Hom | H05K 7/20781 165/181 |
| 2021/0208647 A1 * | 7/2021 | Macias | G06F 1/20 |
| 2021/0267095 A1 * | 8/2021 | Heydari | H05K 7/20836 |
| 2022/0087079 A1 | 3/2022 | Chen et al. | |
| 2022/0210953 A1 * | 6/2022 | Gao | H05K 7/20254 |
| 2022/0338374 A1 * | 10/2022 | Heydari | H05K 7/20281 |
| 2023/0077114 A1 * | 3/2023 | Korta | H05K 7/1489 |
| 2023/0301021 A1 * | 9/2023 | Gao | H05K 7/20781 |

(Continued)

OTHER PUBLICATIONS

1 Extended European Search Report for EP App. No. 22216025.1 dated Jun. 6, 2023, 13 pages.

(Continued)

*Primary Examiner* — Courtney L Smith
(74) *Attorney, Agent, or Firm* — Miller Johnson

(57) ABSTRACT

A server rack system for receiving and coupling one or more electronic components to a vehicle system includes a housing. The housing is configured to receive the one or more electronic components. The server rack system includes a heat-conducting structural component. A cooling system includes a heat source and a heat sink. An active cooling system includes a cold plate coupled to a cooling system defining a heat sink. A passively cooled electronic component defines a heat source. A hybrid cooling system is configured to provide a heat transfer from the passively cooled electronic component to the cold plate by heat conduction via the structural component.

7 Claims, 7 Drawing Sheets

(56) References Cited

U.S. PATENT DOCUMENTS

| | | | | |
|---|---|---|---|---|
| 2023/0403829 | A1* | 12/2023 | Heydari | H05K 7/2079 |
| 2023/0413466 | A1* | 12/2023 | Heydari | H05K 7/1407 |
| 2025/0087557 | A1* | 3/2025 | Nabovati | H01L 25/0655 |

OTHER PUBLICATIONS

Communication pursuant to Article 94(3) EPC for EP22216025.1 dated Dec. 2, 2025, 5 pages.

* cited by examiner

SERVER RACK FOR ELECTRONIC COMPONENTS

CROSS-REFERENCE TO RELATED APPLICATIONS

This application claims priority to European App. No. 22 216 025 filed Dec. 22, 2022, the entire disclosure of which is incorporated by reference.

FIELD

The present specification relates to computer server mounting systems and more particularly to server racks with cooling systems.

BACKGROUND

Computing system server racks and automotive system server racks are used to connect electronic control units, ECUs, also referred to as blades to external systems to allow them to communicate including for exchange of digital signals, as well as provide sufficient power supply and mechanical protection. There is typically a need to provide cooling within a server rack system as heat generation is associated with the ECUs and related electronic components. Typically, two forms of cooling are envisaged. Namely, passive cooling and active cooling. Passive cooling may be applied in a case where the heat generated is limited or below a threshold level of heat generation. Therefore, in the situation of a server rack some components may be determined to require cooling only to a limited extent and may be passively cooled by natural convection and heat radiation means. If a component is determined to require more cooling than that supported by passive means, then active cooling is normally provided. Active cooling may be provided for example by one or more fans, or a cold plate connected to a cooling system. However, the greater the amount of active cooling provided to a server rack, the greater the costs relating to the manufacture of the server rack device and the greater the ongoing costs for operation including energy costs, and for maintenance of the server rack device. Further additional active cooling may also negatively impact the reliability of the server rack system. For example, moving components, such as fans, are more prone to failures compared to passive components.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The arrangements of the specification are directed to providing improved and bespoke cooling solutions that can accommodate different levels of cooling for different components of a system and provide additional cooling to locations or components that require it.

According to a first aspect there is provided a server rack system (100) for receiving and coupling the one or more electronic components to a vehicle system, the server rack comprising:

- a housing (110) for receiving the one or more electronic components; and

- at least one heat conducting structural component (140).

The server rack comprises a heat conducting structural component. The heat conducting structural component is configured to provide a directed and controlled heat transfer. The provision of a heat conductor within the server rack represents a new approach for directional and controlled heat transfer.

According to an embodiment of the first aspect the server rack system comprises:

- an active cooling system (300) defined by a cold plate (310) coupled to a cooling system (320) defining a heat sink; and at least one passively cooled component (240, 210-1) defining a heat source;
- the server rack system (100) further comprises a hybrid cooling system (400), configured to provide a heat transfer (465) from the passively cooled component to the cold plate (310) by heat conduction via the structural component (140).

The arrangement of the claims advantageously provides a further cooling system within the context of a server rack system, namely a hybrid cooling system. The hybrid cooling system provides for cooling by conduction of heat via the structural component between a heat source and heat sink. This hybrid cooling is provided in addition to any active cooling and/or passive cooling of electronic components and by the configuration of the structural component is configured to be controlled and directed. For example, the hybrid cooling may be provided for specific components that are not actively cooled. The passively cooled components may be electronic components or an ECU comprising electronic components.

According to an embodiment of the first aspect, the cold plate (310-1) is located spaced apart from the passively cooled component (210-1, 240) and the structural component (140) is arranged to extend between the passively cooled component (210-1) and the cold plate (310-1) and is thermally coupled to each.

Advantageously, heat transfer from the source to the cold plate is via the structural component, this arrangement obviates the need for the passively cooled component to be actively cooled, for example arranged coupled to a dedicated additional cold plate.

According to an embodiment of the first aspect, the at least one passively cooled component includes one or more of: a back plane board comprising one or more electronic components, an electronic control unit, ECU, comprising one or more electronic components, a passively cooled electronic component.

The backplane board provides an interface between the ECUs and the vehicle system and is configured for electrically and/or communicatively coupling the one or more ECUs to the vehicle system.

According to an embodiment of the first aspect the server rack further comprises at least one actively cooled ECU (210-2) directly thermally coupled to cold plate (310) at a thermal interface (350) to provide active cooling (305) of the ECU coupled thereto.

In an arrangement one or more ECUs (210-2, 210-3) may be determined to require active cooling (305), for example based on a measurement of the heat generated by the ECUs and components thereof during operation. The actively cooled ECU are directly thermally coupled to cold plate (310) at a thermal interface (350) between a contact surface portion of the housing of the ECU and a contact surface portion of the cold plate to provide active cooling (305).

According to an embodiment of the first aspect the cold plate comprises at least two thermal interfaces (350, 460). the cold plate (310-1) to each of two heat sources (210-2, 210-1).

In an arrangement, the cooling system comprises at least two thermal interfaces (350, 460) coupling the cold plate (310-1) to each of two heat sources (210-2, 210-1)), the thermal interfaces including: a first thermal interface (350) provided between a contact surface area (218) of the actively cooled ECU (210-2) and a cold plate interface area (312) of the cold plate (310-1), and a second thermal interface (460) provided between a contact surface (160) of the structural component (140) and a corresponding cold plate interface area (313) of the cold plate (310-1). Optionally the surface area of the first thermal interface (350) is greater than the surface area of the second thermal interface (460). The cold plate is directly coupled to the actively cooled ECU (210-1) at the first thermal interface and wherein the cold plate is coupled to the structural component (140) of the housing (110) at the second thermal interface.

According to an embodiment of the first aspect one or more of the heat sources (ECU, backplane board, electronic components), housing and heat sink (cold plate connected to cooling system) comprises a structural component comprising heat conducting portions (140, 211, 311) configured to provide for heat conduction and heat transfer (455) for hybrid cooling (405).

In an arrangement, the housing of an ECU or a portion of the backplane board, or a cold plate may comprise a conducting structural component or a conducting portion. For example, the housing of an ECU may comprise a conducting portion configured to conduct heat to the structural component.

According to an embodiment of the first aspect a thermal interface (450) is provided between a contact surface (150, 170) of the structural component (140) and a corresponding contact surface (219, 241) of the passively cooled component (210-1, 240).

Advantageously, the heat sources/passively cooled components and the structural component are configured to be thermally coupled. The system is configured to provide thermal interfaces between the components.

Advantageously, the hybrid cooling system provides for heat transfer at thermal interfaces of the hybrid system and via the structural component. The structural component and the heat sources and heat sink may each comprise contact surfaces configured for coupling to define the thermal interface between the components i.e. one or more heat sources and structural component and structural component and one or more heat sinks.

According to an embodiment of the first aspect the hybrid cooling system provides that a thermal interface material, TIM, (470) is provided between corresponding contact surfaces (218, 312, 150, 219, 160, 313, 170, 241) of the structural component, and a heat source or heat sink respectively, at each thermal interface (350, 450, 460).

Advantageously the TIM provides a positive thermal coupling of the respective components active in heat transfer at the thermal interfaces for efficient heat transfer. In a further arrangement, a TIM may be provided located between a component (heat generating component of an ECU) and the ECU housing to provide heat transfer from the component to the ECU housing and to the structural component. The ECU housing may also comprise a conducting portion to provide heat transfer to the thermal interface to the structural component. Therefore, in an arrangement heat is transferred via a TIM from a component to a thermal interface with the structural component. A TIM may be provided at each thermal interface.

According to an embodiment of the first aspect the contact surface (contact surface of heat source, structural component, cold plate active at the thermal interface) comprises one or more of a roughened surface portion, a coated surface portion, a smoothened surface portion.

Advantageously one or more of the contact surfaces that are coupled to form a thermal interface within the system may comprise a treated surface portion. That surface portion may for example be a roughened surface portion, a coated surface portion or a smoothened surface portion. For example, a smoothened surface portion may be obtained by milling. The smoothened surface may provide for forming an improved thermal interface with improved heat transfer.

According to an embodiment of the first aspect the thermal interface and the structural component are configured to have a low thermal resistance.

Advantageously a low or minimized thermal resistance between heat sources (240 or ECU 210-1) and a heat sink (310, 325) allows for efficient transport of thermal energy. In addition, the heat transfer path length may be limited to support low thermal resistance.

According to a second aspect there is provided a hybrid cooling system (400) for providing cooling of one or more non-actively cooled heat sources of a server rack system (100), the server rack system comprising:

- a rack housing (110) configured to receive one or more electronic components defining one or more heat sources including at least one non-actively cooled heat source;
- an active cooling means (300) comprising one or more cold plates (310) connectable to a cooling system such that a coolant circulates between the one or more cold plates and the cooling system defining a heat sink;
- wherein the hybrid cooling system (400) comprises a heat conducting structural component configured to provide heat transfer by conduction between the at least one non-actively cooled heat source and the heat sink.

According to an embodiment of the second aspect, the structural component is coupled to a heat source at a first thermal interface and to the heat sink at a second thermal interface, and wherein hybrid cooling (405) is provided by a heat transfer from the heat source to the heat conducting structural component at the first thermal interface, the heat conducting structural component providing heat conduction of the heat from the heat source to the second thermal interface at which a heat transfer is provided from the structural component to the heat sink.

According to an embodiment of the second aspect, the heat conducting structural component comprises a wall (145) of the rack housing located in a vertical orientation between a backplane board (240), one or more ECUs (210) and heat sink (310), the wall (145) comprising a heat conducting material and configured to provide heat transfer by conduction between the non-actively cooled heat source and the heat sink.

It will be appreciated that the housing may comprise different or additional structural components for example at one or more portions of the side walls. The key is that the structural component provides a conduction path for heat transfer as required from a heat source to a heat sink.

Optionally, in an arrangement, the rear wall may further comprise one or more interface contact surfaces configured for coupling to a corresponding interface contact surface of a heat source or heat sink to provide a thermal interface for heat transfer to and from the structural component. Optionally, in an arrangement, the thermal interfaces and contact surfaces of one or more of the heat sources, heat sink and structural component and configured to provide for an efficient heat transfer, wherein a TIM is provided at the thermal interfaces and wherein the contact surfaces are configured to provide for heat transfer.

According to a third aspect, a hybrid cooling means (400) for providing cooling of one or more non-actively cooled heat sources of a server rack system (100), the server rack system comprising:

a rack housing (110) configured to receive one or more ECUs, and a backplane board (240) configured to interface the one or more ECUs to an external vehicle system, the one or more ECUs (210) and the backplane board (240) defining heat sources;

an active cooling means (300) comprising one or more cold plates (310) connectable to a cooling system such that a coolant circulates between the one or more cold plates and the cooling system defining a heat sink;

characterized in that the hybrid cooling means (400) is configured to provide heat transfer by conduction between one or more non-actively cooled heat sources, determined based on expected heat generation during operation, as not requiring active cooling, the hybrid cooling means defined by a heat conducting structural component (140, 145, 120) of the rack housing (110) configured to provide for heat transfer (455) by heat conduction between the one or more non-actively cooled heat sources and the heat sink;

wherein the structural component is coupled to a heat source at a first thermal interface and to the heat sink at a second thermal interface, and wherein hybrid cooling (405) is provided by a heat transfer from the heat source to the heat conducting structural component at the first thermal interface, the heat conducting structural component providing heat conduction of the heat from the heat source to the second thermal interface at which a heat transfer is provided from the structural component to the heat sink.

Optionally in an arrangement, the non-actively cooled heat sources are located spaced apart and separated by a distance from the heat sink. This is in contrast to the arrangement of any heat source that is to be actively cooled—in this case the heat source is directly thermally coupled to the cold plate. The non-actively cooled heat sources may be considered suitable for cooling by mainly passive cooling or in the arrangement where these heat sources are cooled also by hybrid cooling, these heat sources are predominantly passively cooled. Some hybrid cooling us provided for example to specific areas of a heat source that may merit additional cooling but not to the level that an active cooling of the ECUI is indicated.

According to a fourth aspect there is provided a server rack system (100) for receiving one or more electronic control units, ECUs, each ECU comprising a housing for receiving electronic components, and for coupling the one or more ECUs to a vehicle system, the server rack system comprising;

a cooling system (300, 500) comprising an active cooling means (300) defined by a cold plate (310) coupled to a cooling system (320) wherein a cooling fluid is circulated between the cooling system and cold plate to provide active cooling;

the server rack system comprising at least one actively cooled ECU (210-2) determined to require active cooling (305), based on the heat generated by the ECU and components thereof during operation, wherein the actively cooled ECU is directly thermally coupled to cold plate (310) at a first thermal interface (350) between a contact surface portion of the housing of the ECU and a contact surface portion of the cold plate to provide active cooling (305);

the server rack system further comprising a passively cooled component (240, 210-1) determined not to require active cooling, based on the heat generated thereby during operation;

the server rack system (100) further comprises a hybrid cooling means (400), configured to provide heat transfer (455) via the structural component (140) of the housing (110) between a third thermal interface (450) formed between a first contact surface (150, 160, 170) of the housing (100) and a contact surface (215, 241) of a and the passively cooled component (210, 240) and a second thermal interface (460) provided between a second contact surface (150, 160, 170) of the structural component (140) and the cold plate (310).

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

FIG. 1A shows an overview schematic and FIG. 1B provides a detailed view of the hybrid cooling means 400 and the thermal interfaces and heat flow provided in this arrangement.

DETAILED DESCRIPTION

Figure 1A:
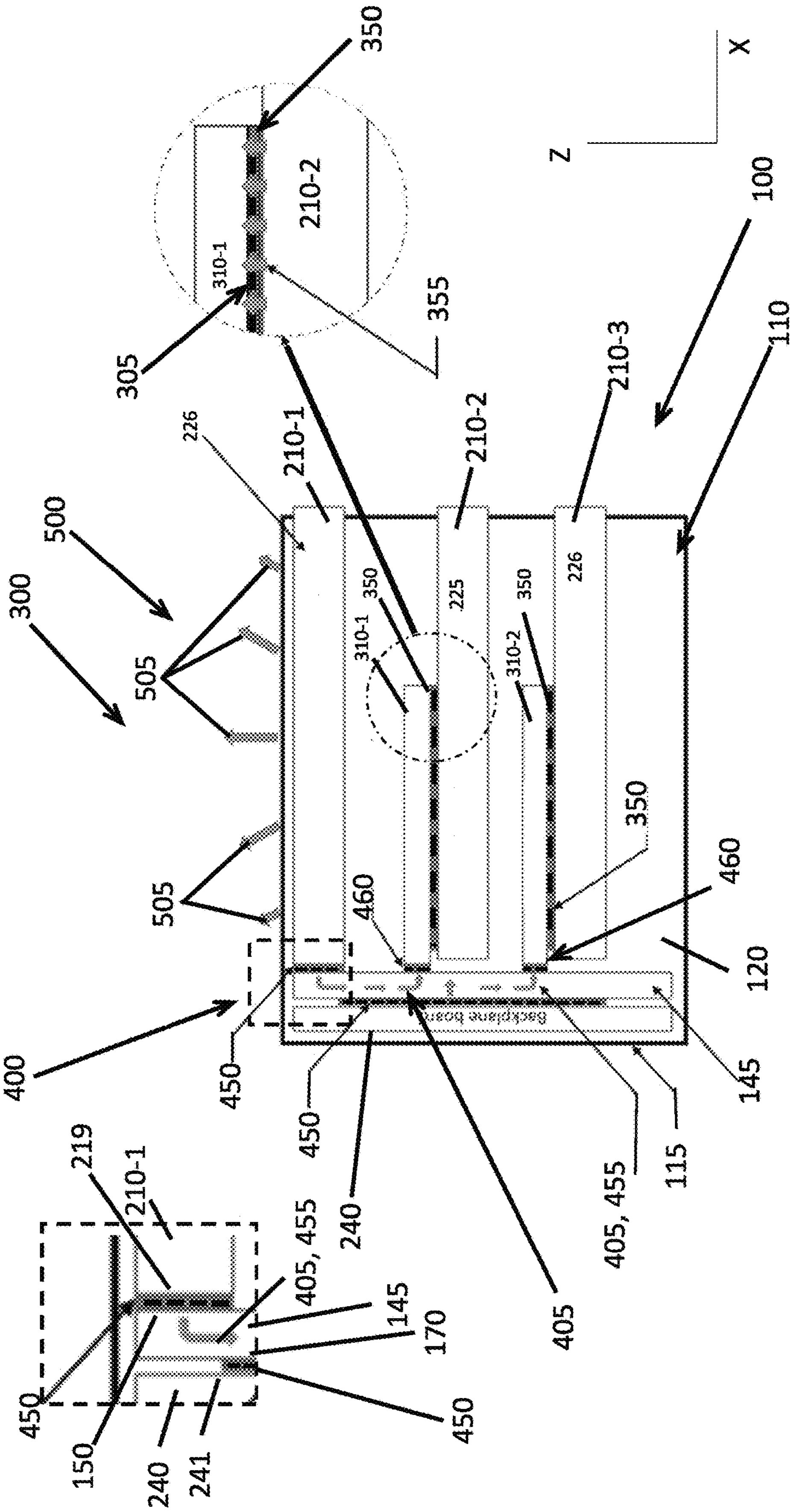
FIGS. 1A and 1B show schematic views of server rack system 100 according to arrangements of the specification
Figure 4:
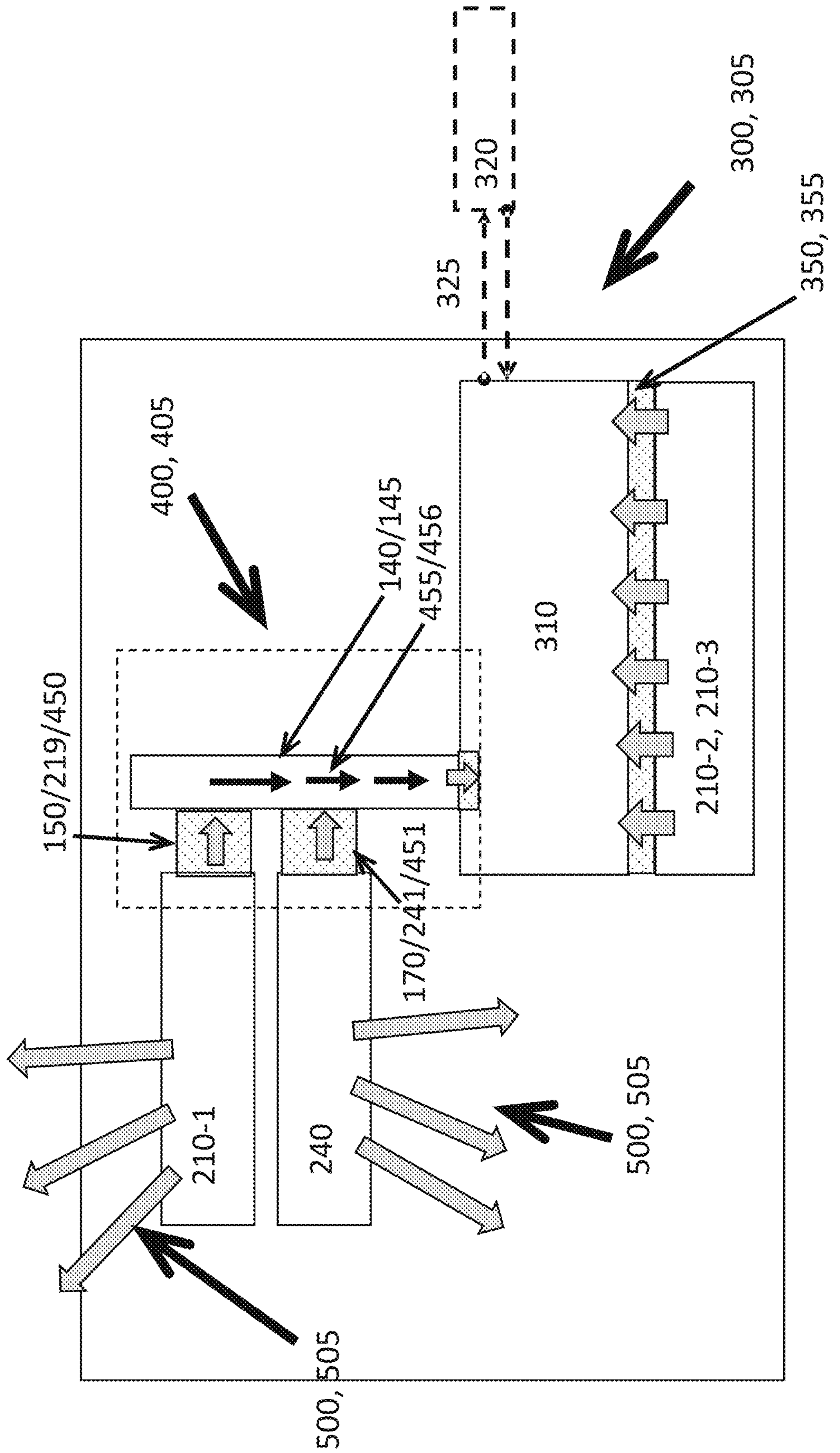
FIG. 4 is a block diagram showing the heat transfer arrangements and means of the server rack system.

Referring to FIG. 1A and FIG. 4, a server rack system 100 according to an arrangement, is described.

Server rack system 100 is configured to accommodate blades 210 also referred to as electronic control units, ECUs, 210. The blades or ECUs 210 may comprise replaceable blades/ECUs 225 and non-replaceable blades/ECUs 226. The ECUs typically house electronic components 291 required for operations of the systems on a PCB 290. Additional electronic components 291 may be provided mounted on the main board 240 also referred to as the backplane board 240 of the server rack system 100. The backplane board 240, and associated electronics, are configured to provide for distribution of power and signals to a connected system, for example a connected main electronic system of a vehicle. The backplane board 240 provides an interface between the ECUs 210 of the server rack system 100 and the main electronic and communication systems of the vehicle.

As illustrated in FIG. 1, selected components in the server rack 100 are configured to be actively cooled 305. In the arrangement shown removable ECUs 210-2 and non-removable ECU 210-3 are configured to be cooled actively. ECUs 210 (2) and 210 (3) are each arranged such that they are thermally coupled with cold plates 310. Active cooling 305 is provided by a connected cooling system 320 and the cold plate 310 arrangement. The cooling system 320 may for example be a fluid cooling system. The cooling system 320 is connected to cold plates 310 to provide for circulation of coolant 325 via flow and return paths through the respective cold plates 310 and to the cooling system 320. While cooling system 320 is described briefly, it is appreciated that he cold plates 310 coupled be connected to various suitable types of cooling system.

A thermal interface 350 is provided between each of the ECUs 210-2 and 210-3 and the cold plates 310-1. 310-2. The thermal interface 350 is provided between a contact surface portion 312 of the cold plate 310 and a contact surface portion 218 of a housing 211 of the ECUs. A heat transfer 355 from the ECU to the cold plate 310 is provided across the thermal interface 350 in the active cooling process 305. There is a heat transfer path 356 between the ECU and the cold plate.

The rack system 100 is further configured to provide passive cooling 505 in addition to the active cooling 305. For example, in the arrangement of FIG. 1 the uppermost ECU 210-1 is shown as being cooled principally by passive cooling 505. The passive cooling 505 is provided including using natural convection and heat radiation to the ambient. The ECU 210-1 is configured including by its location at an upper portion of the server rack system to provide passive cooling 505. The server rack system 100 may having an open to the ambient at the ECU 210-1.

The arrangement of the server rack 100 is therefore configured to provide both a passive cooling 505 and active cooling means 305.

By limiting the implementation of active cooling 305 to the components or regions of the server rack 100 where it is necessary, for example ECUs 210-2 and 210-3, the arrangement advantageously allows cost savings and further supports limitation of the risk of malfunction of these systems. The specification therefore provides an automotive server rack 100 with passive cooling 500 and active cooling 300 means.

The arrangement of FIG. 1 further provides for an intermediate level of cooling also referred to in this specification as a hybrid cooling 405. The hybrid cooling 405 is provided via a hybrid cooling system 400. The hybrid cooling 405 is based on providing a thermal coupling of non-actively cooled electronic components and components of the server rack system 100 to provide a heat transfer to the active cooling means 300 located within the server rack system and connected to the external cooling system 320.

The non-actively cooled electronic components are those components e.g. ECU 210-1 and backplane broad 240 which are not directly coupled to a cold plate 310 for direct active cooling 305 at an active cooling thermal interface 350. In FIG. 1, the non-actively cooled electronic components 210-1 and 240 are cooled by passive cooling 505 and in the specification these components are also referred to as passively cooled components. As discussed already above, depending on the heat generated some electronic components do not require active cooling by provision of a direct thermal coupling at an actively cooled thermal interface. It is advantageously economical and reduces overheads and maintenance if such components are not arranged for active cooling by provision of a dedicated cold plate. Such components within the system 100 are configured for passive cooling 505. They may also be configured for hybrid cooling 405.

These non-actively cooled components, also referred to as passively cooled components or predominantly passively cooled components may as described below benefit from the hybrid cooling means 400 of the server rack system 100 of the present specification.

The hybrid cooling system 400 of the server rack system 100 is configured to provide a further heat transfer path within server rack system 100 in addition to the active cooling 305 and passive cooling 505 arrangements 300, 500. In the arrangement, the active cooling means 300 comprises one or more cold plates 310 connected to external cooling system 320 which are directly coupled to selected ECUs 210-2, 210-3. The passive cooling means 500 provides passive cooling 505.

The server rack system 100 comprises a housing 110 for receiving ECUs and components of the active cooling system 300. The housing 110 and is further configured to provide for heat transfer as part of the hybrid cooling system 400. The housing 110 comprises one or more structural components 140. Structural components 140 of the housing active in the hybrid cooling arrangement are heat conducting. The housing 110 comprises rear wall 145, side walls 120, and an external cover 115. In particular, heat transfer 455 for hybrid cooling 405 is via structural components 140 of the housing 110 including in the arrangement the rear wall 145. The structural components 140 including rear wall 145 of the server rack 100 are strategically configured to provide for and to direct heat transfer 455 between specified components or regions of the overall system. The heat transfer 455 is by heat conduction.

In addition, or alternatively portions of the side walls 120 may also be defined as structural components 140 of the rack and in that case are also arranged to provide for heat transfer 455 for hybrid cooling 405 and be heat conducting.

The structural components 140 of the server rack are configured to create defined heat transfer paths 456 within the server rack system 100 to facilitate the hybrid cooling 405. The hybrid cooling means 400 provides for a transfer of heat for hybrid cooling 405 from selected heat generators via the structural components 140 of the housing 110 to the active cooling means 300, 310, 320, in the case of the drawings.

In this case, one or more thermal interfaces and one or more heat transfer paths are provided that support cooling via the hybrid cooling system. The hybrid cooling 405 is at a rate lower than that provided by direct active cooling 320 such as provided by active heat transfer 355 by cooling plates 310 at the heat transfer interfaces 350 between the cold plates 310 and ECUs 210-2 and 210-3. Hybrid cooling 405 is provided in addition to passive cooling of the selected components 210-1. 240 and therefore contributes to cooling of non-actively cooled components at a rate greater than that supported by the passive cooling 505 only.

The intermediate cooling or hybrid cooling 400 at a heat generator may be supported by providing a thermal interfaces 450, 460, for hybrid cooling, of relatively limited surface area for example in comparison with a thermal interface 350 between a cold plate and ECU for active cooling.

For example, thermal interface 450 could be provided at location of a surface region of an ECU, in the case that a particular component of a passively cooled ECU was determined to require cooling greater than that supported by passive cooling 505 only but less than that provided by an actively cooled cold plate 310. The component may be thermally coupled to a portion of the ECU housing for transfer of heat to the housing, and that portion of the ECU housing may in turn coupled to the hybrid cooling means 400.

The server rack 100 comprises hybrid cooling system 400 and is configured to support passive 505, active 305, and hybrid cooling 405.

The configuration of server rack 100 to provide targeted active cooling, passive cooling, and further to provide targeted supplementary hybrid cooling 405, as supported by the implementation of three cooling processes has been found to be advantageous. Server rack 100 provides cost and resource saving including for installation or fitting of different forms of cooling system as required.

This is illustrated for example with reference to FIG. 1. Instead of providing a server rack that has three cold plates 310 each coupled to an ECU and each cooled by active cooling process 305 via cooling system 320, server rack 100 includes one ECU 210-1 that is cooled by both passive cooling 505 and by hybrid cooling 405 processes. Two ECUs 210-2 and 210-3 are cooled by active cooling 305. There are therefore cost and resource saving arising direction from cold plate cost savings and relating to operational costs. Further the hybrid cooling arrangement supports maintenance of the reliability of operation of the server rack 100 by elimination of unnecessary active cooling means.

The arrangements of the specification further encompass processes for making a determination as to the cooling requirements of the server system 100 and of the components 291, 210, 240 located therein. Some electronic components or ECUs 210 require cooling to a level that is between that supported by passive cooling and that supported by active cooling. For example, different types or processes for cooling may be applied depending on the different cooling requirements. The cooling requirements may be determined for example by considering the amount of heat generated over a pre-determined time period. The cooling requirements may be linked to different ranges of heat generated or different maximum or minimum heat output levels. Arrangements of the present specification provide a hybrid cooling 400 that allows an increased cooling capacity of passively cooled 505 components of the server rack, without the need for providing additional active cooling means 300. Characterization of different categories of heat generation, and cooling required is considered in the context of the server rack system 100.

Example of Cooling Processes Applied: To Different Components

| | |
|---|---|
| Passive cooling 300 | ECU 210 (1), Backplane board 240 |
| Hybrid cooling 400 | ECU 210 (1), Backplane board 240 |
| Active cooling 360 | ECUs 210 (2), 210 (3) |

As an example, any issue of insufficient cooling capacity for passively cooled components in the example ECU 210-1 of an automotive rack 100 may therefore be resolved, by providing the hybrid cooling system 400, which allows an increase in cooling efficiency for passively cooling components e.g. ECU 210-1 without requiring the provision of additional actively cooled cold plates 310.

Figure 2:
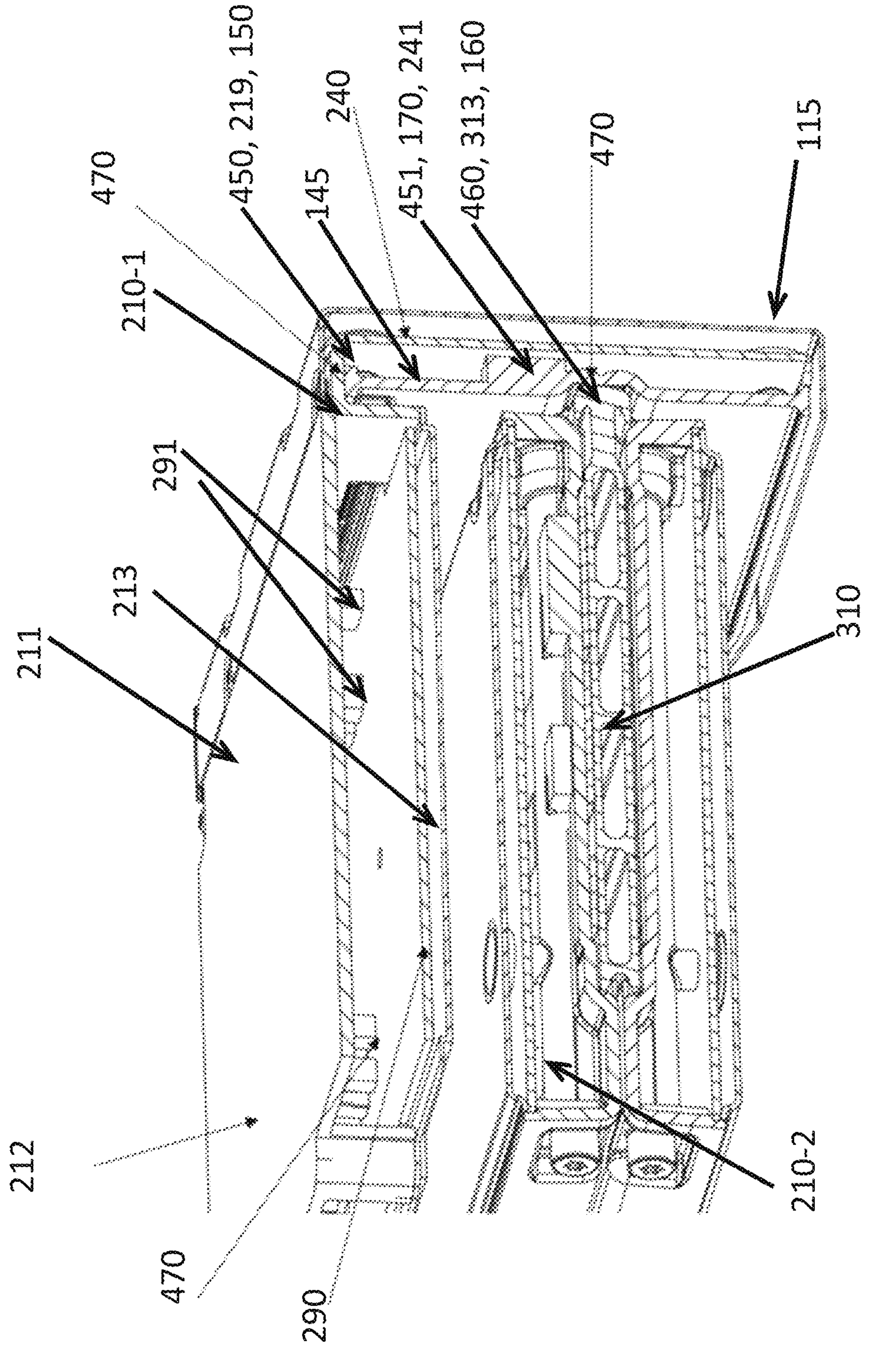
FIGS. 2 and 3 are cutaway cross-sectional views of arrangements according to the specification.
Figure 3:
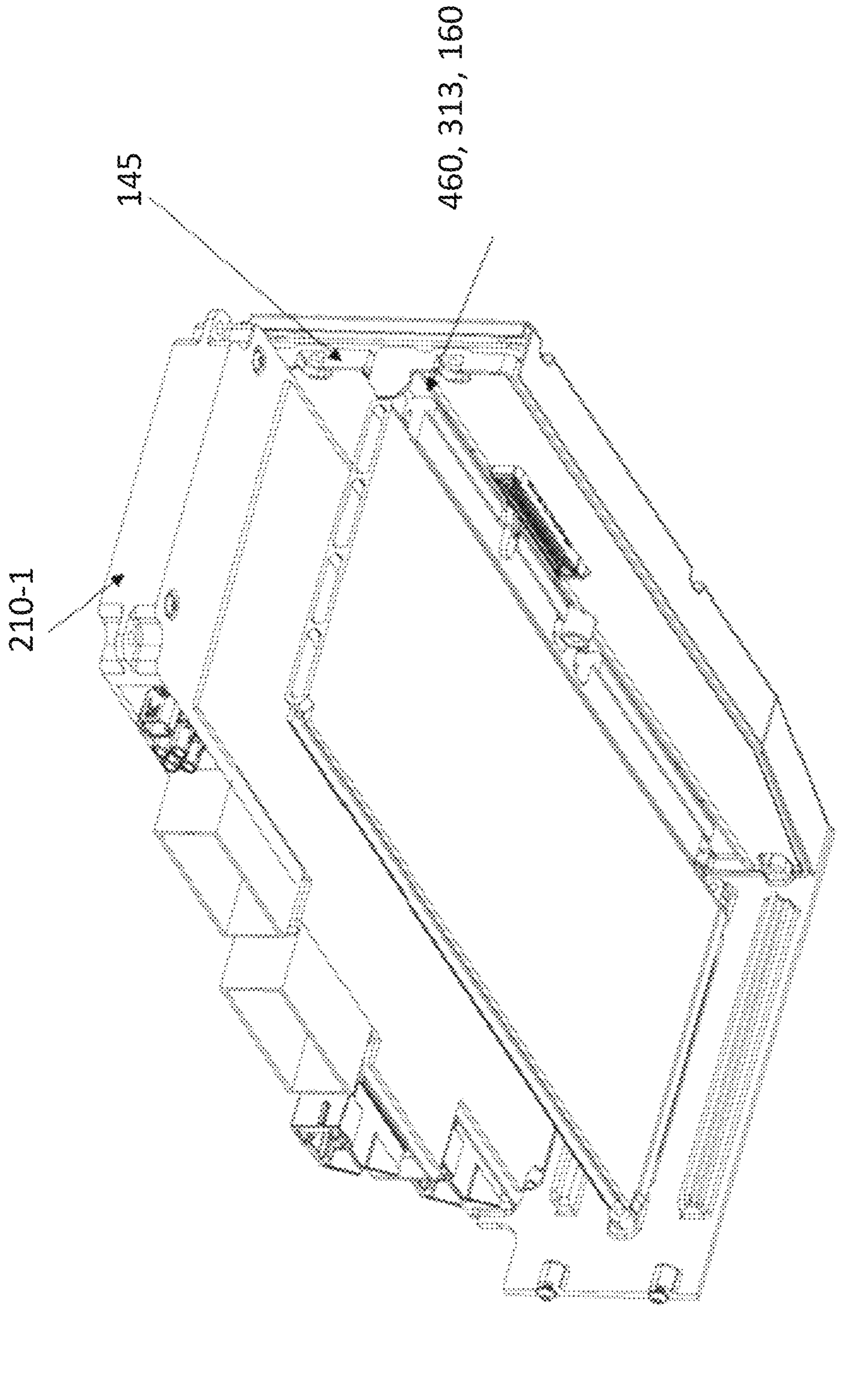

Referring to FIGS. 2 and 3, server rack 100 according to arrangements of the specification, and in particular the hybrid cooling system 400 of the server rack 100, is described in further detail.

The hybrid cooling system 400 is provided integrally formed in the rack 100. The rack 100 is equipped with at least one cold plate 310 that supports active cooling 305. The cold plate 310 is connected to an external cooling system 320 that provides a circulation including flow and return of a cooling fluid via the cold plate 310 for actively cooling the ECUs 210-2 and 210-3.

The hybrid cooling system 400 is directed to provide additional cooling means for passively cooled 505 blade 210 (1) in the arrangement.

In the arrangement of FIG. 2 passively cooled blade 210 (1) is further coupled to the cold plate 310-1 at ECU 210 (2) through a series of thermal interfaces 450, 460 and via a heat conducting structural component 140. Thermal interfaces 450 are provided to allow a portion of the heat generated by the ECU 210(1), to be dissipated by the coolant flowing inside a heat exchanger defined by the active cooling means 300, 310, 320.

In this way, cooling of the blade 210-1, of the arrangement already arranged to be passively cooled 505 by natural convection and radiation cooling is also supported by the hybrid cooling means 400, to provide for heat transfer by conduction to a heat sink. The hybrid cooling 405 contributes to the cooling of blade 210-1 even if the hybrid cooling provided by the coupling via the housing to the heat sink (cold plate 310-1) remotely located relative to the passively cooled blade 210-1, is applicable to dissipation of only some portion of the total heat generated by the device 210-1.

The path 456 for the heat to flow between the blade 210-1 and the cold plate 310 is established through the structural components of the system which includes the structural components 140 of the server rack 100 and of the ECUs 210, cold plates 310 etc.

The structural components 140 of the server rack 100 active in heat transfer include components of the housing 110. The structural components 140 of the housing are portions of the housing configured to be heat conductors and to provide a heat transfer path 456.

In the arrangement the structural components 140 include the rear wall 145. Side walls 120 may also be arranged to be active in the heat transfer. It will be appreciated that the housing may comprise additional or alternative heat conducting structural components 140. Similarly structural components of the ECU active in this hybrid cooling 405 include portions of the housing 211 such as portion of external walls of the housing or a contact or interface area 219 of the housing 211. Similarly, the cold plate 310 comprises a housing 311 having one or more interface or contact areas configured as locations for thermal coupling. At least portions of the housings 110, 211 and the housing 311 of the cold plate may be configured for heat transfer or for thermal coupling. Portions of the housings may be comprised of a conducting material. Portions of the housings may be configured to define a contact surface for interfacing with corresponding components for example to form a thermal interface.

Figure 1B:
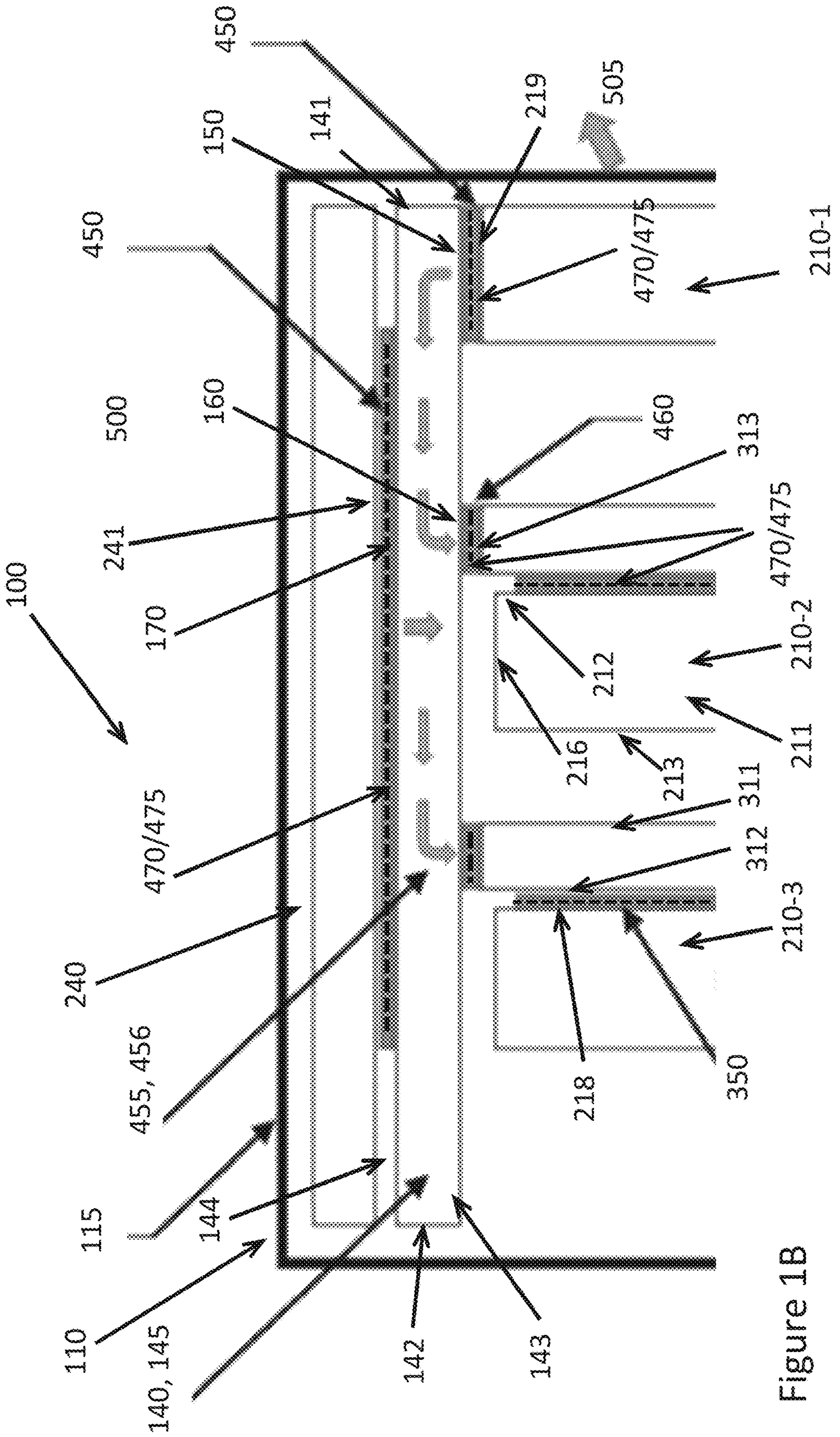

In FIG. 1B, as an example of the hybrid cooling 405, a thermal flow path or heat transfer path 456 is established between ECU 210-1 and cold plate 310-1. Cold plate 310-1 is also arranged in direct thermal contact with ECU 210-2 and accordingly configured to provide active cooling 305 thereof as a primary activity of the cold plate. In a secondary activity of the cold plate 310 the cold plate is operational to provide some cooling to the ECU 210-1 via the hybrid cooling means 400.

The ECU 210-1 is mainly cooled by passive cooling. The ECU 210-1 is described herein as a non-actively cooled ECU—it is not directly coupled to a cold plate for active cooling at a direct active cooling thermal interface. ECU 210-1 does not generate so much heat that it is determined to require active cooling.

As shown in the FIGS. (FIGS. 1 to 4) ECU 210-1 is located spaced apart from the cold plate 310. They are separated by a physical distance. The ECU 210-1 and cold plate 310-1 are located at different levels (Z direction) within the server rack system 100. There is no direct physical contact between the cold plate 310 and ECU 210-1. However, in accordance with the hybrid means 400, some of the heat generated at ECU 210-1 is conducted via heat conducting structural components 140 such as rear wall 145 to the cold plate 310. The rear wall 145 comprises thermal interfaces 150 and 160 with each of the ECU 210-1 and cold plate 310 and the rear wall 145 extends the separation distance SD1 between ECU 210-1 and cold plate 310 and defines a heat transfer path 456 between them. Heat transfer is by conduction and the materials and arrangement of each of the structural component and the thermal interfaces is configured to provide an efficient heat transfer.

While in the example ECU 210-1 has been indicated as an component that is passively cooled and additionally cooled by hybrid cooling, it is appreciated that this above description and drawings are intended to provide a non-limiting example. It is not intended that the types of components configure for passive and hybrid cooling be thus limited.

Each of the ECUs 210 comprise a housing 211 having an upper wall/top cover wall 212 and a lower wall/base wall 213 and side walls 214, 215 and rear (backplane board 240 facing) end wall 216, and forward-facing end wall 217. In the arrangements shown lower surface 212 of the ECU may further comprise a thermal interface contact surface area or portion 218 for contacting a corresponding interface contact surface portion 312 of the cold plate for thermally coupling thereto. The thermal interface contact area 218 is the site or location of coupling of the actively cooled ECU 210-2 of the arrangement to the corresponding cold plate 310-1.

As noted above the ECU housing 211 may further comprise a contact or interface area 219 for coupling to the hybrid cooling arrangement 400. This interface area 219 of passively cooled ECU, such as for example ECU 210-1 of the arrangement, is provided for coupling to the hybrid cooling means 400. If a particular component located with an ECU, for example ECU 210-1 is identified as a heat generator that is to be cooled via hybrid cooling 405, a thermal interface material 470 may be located between the component and an inner surface of the housing at contact or interface area 219 of the housing 211 of the passively cooled ECU 210-1. The TIM 470 being provided to promote heat transfer to the housing 211 for transfer to the hybrid cooling means 400.

In the arrangement shown, the rear wall 145 of the rack is a key structural component 140 active in hybrid cooling 405. The rack 100 comprises a rear wall 145. The rear wall 145 has a depth d and extending from an upper end 141 to a lower end 142. The rear wall 145 has an ECU facing surface 143 and a backplane board facing surface 144 and is arranged in use in the arrangement of the drawings in a generally vertical plate (Z) while the blades 210 are arranged within the rack in generally transverse planes (XY). The rear wall 145 is formed of a thermally conducting material 146. The rack further comprises side walls 120.

The ECU facing surface 143 may comprise one or more ECU/component coupling interfaces 150 and one or more cold plate coupling interfaces 160. The backplane facing surface 144 may comprise one or more backplane board coupling interfaces 170. The coupling interfaces 150, 160 and 170 are configured to provide a thermal coupling between the server rack 100 and in particular in the example shown the rear wall 145 thereof and other components of the server rack system 100 including heat generators (also referred to as heat sources) e.g. ECUs 210, backplane board 240, and heat sinks e.g. cold plates 310.

In use, as shown in FIG. 1 several thermal interfaces 450, 451, 460 are provided between the rear wall 145 and other components of the server rack 100.

The hybrid cooling system 400 requires, that thermal interfaces 450, 451, 460 between these components are heat conductive and effectively arranged to provide for heat transfer as required. Thermal interfaces 450 include thermal interface 450-1 between the rear wall 140 at contact surface/coupling interface 150 and ECU 210-1; and thermal interface 460 between the rear wall at contact surface/coupling interface 160 and cold plate 310 contact interface 313. A further thermal interface 451 is provided between the rear wall coupling surface 170 and the backplane board 240 at a thermal coupling interface 241 thereof.

The rack rear wall 145 effectively defines a heat conductor/a heat conducting and transfer path 456 configured and arranged to provide heat transfer 450 between heat generators and heat sinks.

The thermal interfaces including the above noted interfaces 450, 451 and 460, between the rear wall 145 and heat sources and sinks, and/or the thermal interfaces 350, between the cold plates and ECUs, may further comprise thermal interface materials, TIMs, 470 and/or by providing a surface treatment 475 in the contact regions. The TIMs are provided at the thermal interface to provide an improved thermal coupling and improved heat transfer.

The surface treatment 475 may include providing at portions of the surface a defined level of smoothness or low friction. The surface treatment 475 may additionally or alternatively include providing regions of the surface having a particular roughness. It will be appreciated that different types of surface treatment 475 may be provided. It will be appreciated that the different types of surface treatment 475 may be provided in accordance with requirements and the operational environment of the server rack, for example a surface roughness may provide improved grip between particular selected corresponding contact surfaces.

Thermal interface 450-1 is provided at the coupling between the rear wall 145 and the blade 210 (1). The rear wall 145 is thermally coupled to the blade 210 (1) at the thermal interface 450 such that there is a heat transfer between the ECU 210 (1) and the rear wall 145. A thermal interface material 470 may be located between contact surfaces 150 or interface surfaces 150 of the rear wall 145 and contact surface 218 of the housing 211 of the ECU 210 (1) at the thermal interface 450. The contact surfaces 150, 218 are located for coupling and the TIM 470 is arranged at the thermal interface 450. The contact surface and TIM 470 provide a coupling with the required levels of force such that the thermal interface 450-1 is maintained in positive contact as required for heat transfer to define the heat transfer path 456. The coupling achieved at the thermal interface 450 provides for a continuous, efficient and even heat transfer across the interface 450 and according provides for efficient heat transfer from the heat generator to heat transmitter 140 of the hybrid cooling means 400.

The rear wall 145 is further thermally coupled to the cold plate 310 (1) at thermal interface 460 between the contact surface 160 of the rear wall and a contact surface 312 of the cold plate 310(1) such that there is a heat transfer 455 between the rear wall 140 and the cold plate 310(1). Rear wall 140 is similarly coupled to the cold plate 310 (2) at thermal interface 460. The contact surfaces 160 (160-1, 160-2) are located for coupling and a TIM 470 may be arranged at the thermal interface 450-2 which is configured to provide a coupling with the required levels of force such that the thermal interface 460 is maintained as required for a continuous, efficient and even heat transfer across the interface 460—to provide for heat transfer from the heat generator to the heat sink The structural components of the housing and the heat generator and heat sink being arranged, together with the TIM 470 (where provided) to generate a contact force between each of contact surfaces of the thermal interface to provide for a secure and stable thermal interface. The forming or provision of a secure and stable thermal interface may be further benefit from the arrangement of the surfaces—form of the corresponding contact surface as arranged for coupling, and/or any surface treatment, and/or the TIM used, and/or a combination of these features.

It is appreciated that the cold plane when coupled for both active and hybrid cooling comprises two thermal interfaces with the system—the first 350 between a contact surface 311 of the cold plate 310 a surface contact portion 218 of the ECU housing 211 of ECU 210-2, the second 460 between a contact surface 312 of the cold plate 310 and a contact surface 160 of the housing 110.

Further, the rear wall 145 is coupled to the back plane board 240 at thermal interface 451.

The hybrid cooling 405 provided at blade 210-1 is configured to provide a heat transfer from the blade 210-1 via rear wall 140 of the rack 100 to the cold plate 310-1. The hybrid cooling 405 provided at backplane board 240 is configured to provide a heat transfer from the back plane board 240 via rear wall 145 of the rack 100 to the cold plate 310-1 and/or cold plate 310-2.

Furthermore, the structural components i.e. of housing 211 of blades 210, structural component 140 of the rack defined for example by rack walls 145, 120 and cold plate 310 are comprised of materials that are heat conducting. For example, the structural components may be comprised for example of Aluminum and/or Copper and/or copper alloys or other suitable materials.

In such situations, the thermal resistance between the heat source (e.g. backplane board 240 or ECU 210-1) and the heat sink, i.e., the cold plates 310 and coolant fluid circulating therethrough, can be minimized, to allow for efficient transport of thermal energy.

The arrangement of specification provides for the determination of the thermal resistances of the components and the cooling requirements of heat generating components of the system.

The lower this thermal resistance of a heat transfer path 356, 456, the more heat is dissipated between the heat sources and heat sinks for example from an ECU 210 to a cold plate 310 to which it is thermally coupled. The more cooling that is provided via the hybrid cooling process 405 which is configured to act via the thermal interfaces 450 between the structural components, the more efficient the hybrid cooling 405.

The rack sever system comprises ECUs and components that generate heat to the extent that an active cooling is required. For example, when the heat generation by components of a particular ECU is above a defined threshold level active cooling is typically provided to allow for operation of device—in the context of the present arrangement the ECU and server system. Some components of the server rack may however generate less heat or heat below threshold levels such that they are determined as not having a requirement for active cooling to the extend provided by the active cooling means and cold plate. Such components 240, 210-1 may then be arranged within the server rack such that they are not directly coupled to a cold plate 310 of the active cooling means 300. The cold plate 310 provided with the server rack is arranged to provide active cooling of an electronic component/s, in this case ECU 210-1. However, when also coupled to a passively cooled component via structural components of the housing to provide hybrid cooling 400, the cold plate thus arranged has two thermal interfaces at which heat transfer is provided to the cooling system. The first thermal interface 350 is that between a portion of the surface of the ECU and a surface of the cold plate. The further thermal interface 460 is a separately located thermal interface provided between a structural component of the rack housing and the cold plate. The cold plate 310 is thus arranged and configured within the server rack system 100 to provide for active cooling at two separate thermal interfaces. It will be appreciated that the cold plate 310 could be arranged to provide cooling at a further or additional separate thermal interface.

Other factors that influence the cooling efficiency of the hybrid cooling system 400 of the rack 100 include the following parameters:

- conductivity of the thermal interface materials, TIMs, 470 used to connect the structural components. As described above a thermal interface material 470 may be provided located between the respective contact surfaces of the different structural components. The contact surfaces include contact surfaces of the rack and of the heat generator and heat sink.
- contact surface area of the thermal interfaces 450, 350—the larger the area of the thermal interface or the thermal joint, the lower the thermal resistance of such joint or interface
- length of the heat flow path 356, 456—the shorter the length of such heat conducting path, the lower its thermal resistance.

The present arrangement of the server rack 100 according to arrangement of the specification provides for consideration of the above factor in configuring the hybrid cooling system according to the cooling requirements of a server rack 100. It will be appreciated that depending on the different systems and different components included in a server rack—the cooling requirements can be expected to vary. These parameters are varied as required for particular applications.

The hybrid cooling means 400 of the arrangements of specification advantageously enhance natural convection and radiation cooling of the passively cooled ECU 210 (1).

Referring further to FIGS. 1 and 4, a schematic of the hybrid cooling arrangement 400 of server rack 100 is described. Top blade/ECU 210(1) is passively cooled 505 by natural convection and thermal radiation. Additionally, it is connected through a series of thermal interface joints 450 to the structural components 140 of the rack and, eventually, to the cold plate 310(1). The thermal interfaces 450 also referred to as thermal interface joints 450 are provided between defined contract surfaces 150, 160, 170 of the server 100 and the components and cold plate and may further include TIMs 470.

FIG. 2 provides an alternative view of server rack 100 the hybrid cooling means 400. ECU/Blade 210-1 fixed within the rack at the uppermost rack location is arranged such that passive cooling 505 applies the blade 210-1 thus arranged is cooled including by natural convection and thermal radiation. Further by thermal connection to the rear wall 140 and cold plate 310 by providing thermal interfaces 450 including thermal interface material 470 in several places supports hybrid cooling 405. In the arrangement provided hybrid cooling 405 is based on heat conduction 406.

FIG. 3 provides a cut-away cross-sectional view of a server rack system 100 according to an arrangement of the specification with ECUs, cold plate and rack features shown. The FIG. shows thermal interfaces of the hybrid cooling arrangement 400 between the mounted ECUs, rack wall with cold plate.

Figure 5A:
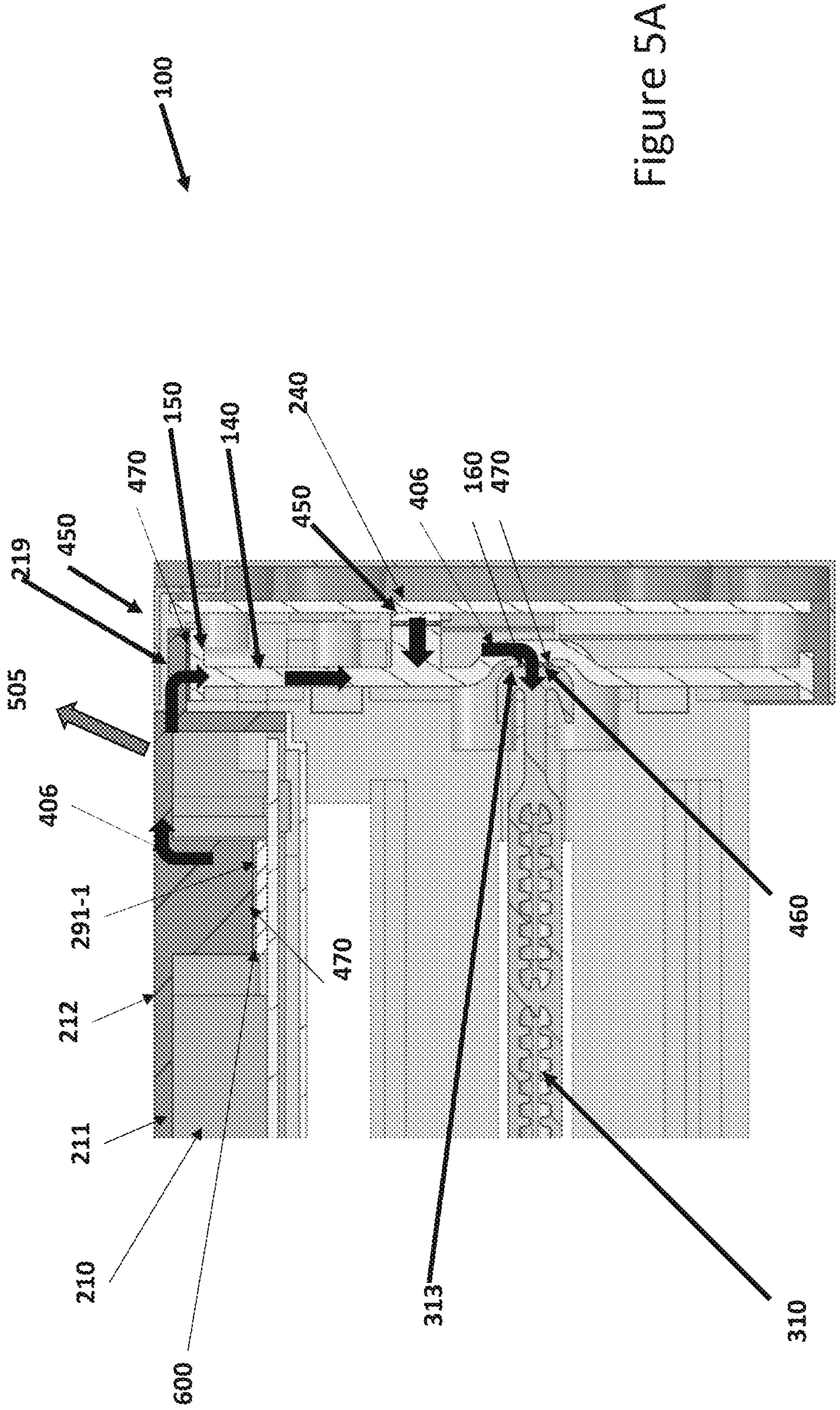
FIGS. 5A and 5B are cutaway cross-sectional views of arrangements according to the specification.
Figure 5B:
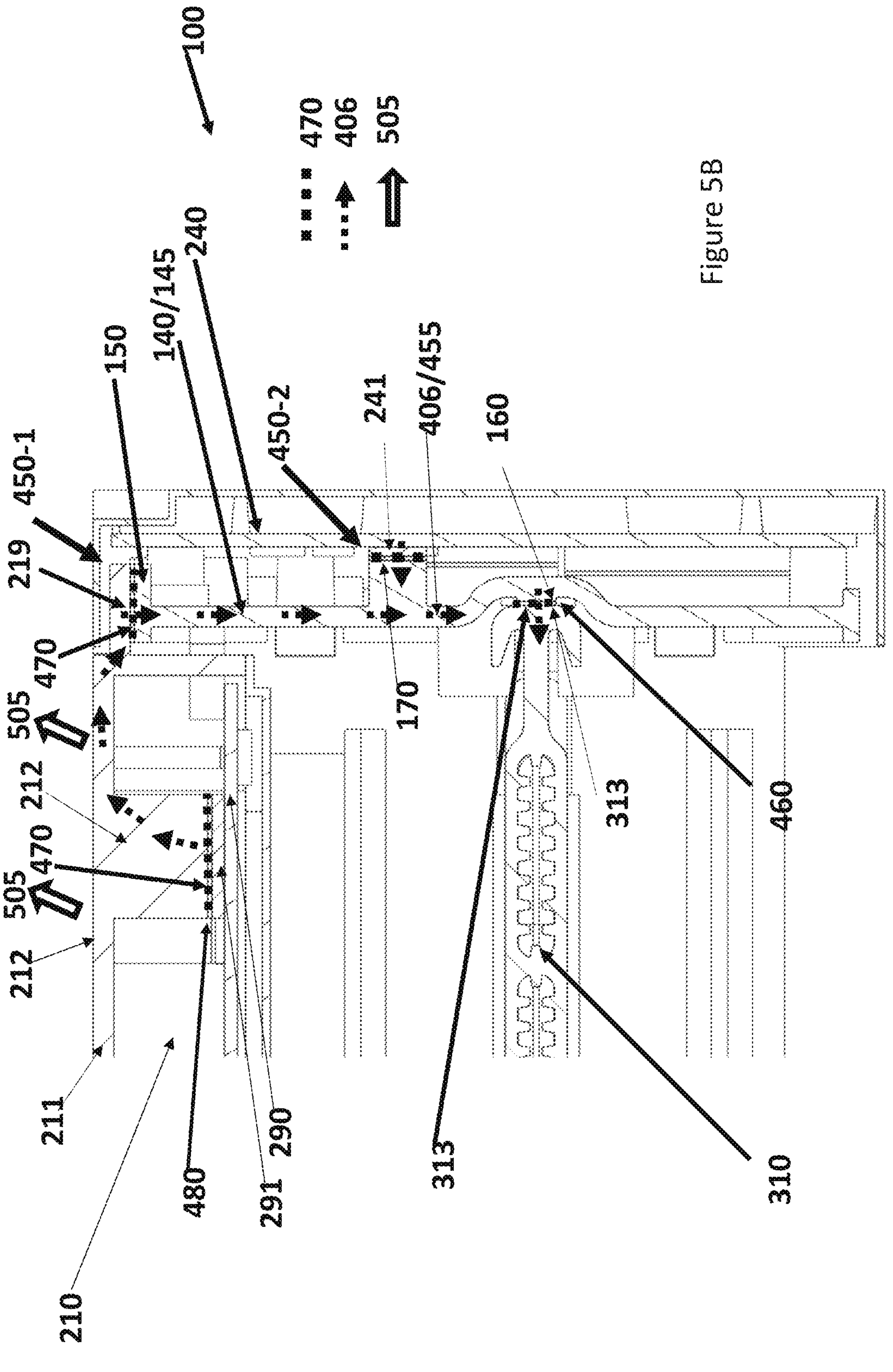

Referring to FIGS. 5A and 5B a further arrangement is described. Many of the features have been described above with reference to server rack 100. Here a heat transfer by hybrid cooling system 400 from a component 291-1 located on an ECU 210-1 is described in further detail.

ECU 210-1 comprises a housing body 211, a top or upper cover wall 212, lower wall 213, PCB, 290. The upper surface 212 comprises a heat conducting structural component. The upper surface 212 comprises a heat conducting material, as illustrated heat is conducted 406 from the component 291 via the housing portion 212 to the thermal interface 450 with the structural component 140 of the server rack. In this example the structural component, a heat conducting structural component comprises a rear wall 145 located between the backplane board 240 and ECUs, and cold plate 310.

A first thermal interface 480 is provided between an electronic component 291-1, located on the PCB 290 and the top cover wall 212. A TIM 470 is located between the electronic component and the top cover wall 212. The thermal interface 480 is configured to provide a heat transfer from the component 291 which defines a heat source to the housing 211 in a first step. It is noted that passive cooling 505 occurs between the housing 211 of the ECU 210 and the ambient. Heat conduction 406 according to the hybrid cooling system 400 is provided via structural components 212, 140 of the ECU housing and the server rack to the cold plate 310.

Heat is conducted from the component 291 via the housing 212 to a second thermal interface 450 with the structural component 140, 145. A contact surface 219 of the ECU housing 211 is coupled at the thermal interface 450 (450-1) with a contact surface 150 of the structural component. TIM 470 is located between the contact surfaces. Heat is conducted 406 via the structural component 140, 145 from the thermal interface to the cold plate 310, the cold plate defining a heat sink.

A further third thermal interface 450 (450-2) is provided between the backplane board 240 and the structural component 140. A contact surface 241 of the backplane board 240 is coupled at the thermal interface 450 (450-2) with a contact surface 170 of the structural component. TIM 470 is located between the contact surfaces. Heat is conducted 406 via the structural component 140, 145 from the thermal interface 450 to the cold plate 310, the cold plate defining a heat sink.

A further fourth thermal interface 460 is provided between the structural component 140 and the cold plate 310. A contact surface 160 of the structural component is coupled at the thermal interface 460 with a contact surface 313 of the cold plate 310. TIM 470 is located between the contact surfaces. Heat is conducted 406 via the structural component 140, 145 from the heat sources, defined by electronic components at the ECU and backplane board to the cold plate 310, the cold plate defining a heat sink.

In the arrangement structural components of the ECU housing 211, 212, structural component 140/145 of the server rack housing, and the housing 311 of the cold plate for example at the contact portion 313 thereof define together a heat transfer path 456 for hybrid cooling 405 by heat transfer 455. The heat transfer is by heat conduction 406 via the structural components. Heat is conducted via these structural components. The structural components are configured to be heat conducting. The hybrid cooling system 400 further comprises thermal interfaces 350, 450, 460, 470, 480 are provided between the structural components, the heat sources, in the example of FIG. 5 component 291 and the heat sink in the example of FIG. 5 the cold plate 310 connected to a cooling system.

While in the specification, the hybrid cooling system 400 has been described in particular with reference to the thermal coupling and heat transfer paths 456 provided via the rear wall 140 of the server rack, it will be appreciated that thermal interfaces and heat transfer paths between heat generators and heat sinks may also be provided via other wall of the server rack by providing as described above thermal interfaces between the server rack and components and between the server rack and heat sink. The thermal interfaces may include a TIM, as described above.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A server rack system for receiving and coupling one or more electronic components to a vehicle system, the server rack system comprising:

a housing configured to receive the one or more electronic components;

a heat-conducting structural component;

an active cooling system defined by a cold plate coupled to a cooling system such that a coolant circulates between the cold plate and the cooling system, the cooling system defining a heat sink;

at least one passively cooled electronic component, wherein the at least one passively cooled electronic component is included in the one or more electronic components; and a passive cooling system configured to provide a heat transfer from the at least one passively cooled electronic component to the cold plate by heat conduction via the heat-conducting structural component, wherein:

the cold plate is located spaced apart from the at least one passively cooled electronic component, the heat-conducting structural component extends between the at least one passively cooled electronic component and the cold plate and is thermally coupled to each, the cold plate includes a first thermal interface and a second thermal interface that are configured to thermally couple the cold plate to each of a first heat source and a second heat source, the first heat source being an actively cooled electronic control unit (ECU), and the second heat source being heat from the at least one passively cooled electronic component conducted via the heat-conducting structural component, and a surface area of the first thermal interface is greater than a surface area of the second thermal interface.

2. The server rack system of claim 1 wherein the at least one passively cooled electronic component includes at least one of:

a back plane board, and an electronic control unit (ECU).

3. A server rack system for receiving and coupling one or more electronic components to a vehicle system, the server rack system comprising:

a housing configured to receive the one or more electronic components;

a heat-conducting structural component;

an active cooling system defined by a cold plate coupled to a cooling system such that a coolant circulates between the cold plate and the cooling system, the cooling system defining a heat sink;

at least one passively cooled electronic component of the one or more electronic components defining a heat source; and a passive cooling system configured to provide a heat transfer from the at least one passively cooled electronic component to the cold plate by heat conduction via the heat-conducting structural component, wherein:

the cold plate is located spaced apart from the at least one passively cooled electronic component, the heat-conducting structural component extends between the at least one passively cooled electronic component and the cold plate and is thermally coupled to each, the heat sink includes the heat-conducting structural component, and the heat-conducting structural component includes heat conducting portions configured to provide heat conduction and heat transfer for hybrid cooling.

4. The server rack system of claim 3 further comprising a thermal interface between a contact surface of the heat-conducting structural component and a corresponding contact surface of the at least one passively cooled electronic component.

5. A server rack system for receiving and coupling one or more electronic components to a vehicle system, the server rack system comprising:

a housing configured to receive the one or more electronic components;

a heat-conducting structural component;

an active cooling system defined by a cold plate coupled to a cooling system such that a coolant circulates between the cold plate and the cooling system, the cooling system defining a heat sink;

at least one passively cooled electronic component of the one or more electronic components defining a heat source;

a passive cooling system configured to provide a heat transfer from the at least one passively cooled electronic component to the cold plate by heat conduction via the heat-conducting structural component, wherein the cold plate is located spaced apart from the at least one passively cooled electronic component, and the heat-conducting structural component extends between the at least one passively cooled electronic component and the cold plate and is thermally coupled to each; and a thermal interface material (TIM) at each respective thermal interface between corresponding contact surfaces of (i) the heat-conducting structural component and the heat source and (ii) the heat-conducting structural component and the heat sink.

6. The server rack system of claim 5 wherein the corresponding contact surfaces include at least one of a roughened surface portion, a coated surface portion, or a smoothened surface portion.

7. The server rack system of claim 5 wherein each respective thermal interface and the heat-conducting structural component are configured to have a low thermal resistance.

* * * * *